United States Patent
Hart et al.

(10) Patent No.: US 9,629,259 B1
(45) Date of Patent: *Apr. 18, 2017

(54) REFILLABLE APPARATUS FOR ALIGNING AND DEPOSITING SOLDER COLUMNS IN A COLUMN GRID ARRAY

(71) Applicant: TopLine Corporation, Irvine, CA (US)

(72) Inventors: Martin B. Hart, Irvine, CA (US); Roger C. Young, Yorba Linda, CA (US); Jeffrey Ryan Butcher, Placentia, CA (US)

(73) Assignee: TopLine Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/238,437

(22) Filed: Aug. 16, 2016

(51) Int. Cl.
*B23K 37/00* (2006.01)
*H05K 3/40* (2006.01)
*B23K 3/06* (2006.01)

(52) U.S. Cl.
CPC ......... *H05K 3/4015* (2013.01); *B23K 3/0623* (2013.01)

(58) Field of Classification Search
CPC B23K 37/04; B23K 37/0408; B23K 37/0426; B23K 37/0435; B23K 37/0461; B23K 3/0623; H05K 3/4015
USPC ............................. 228/44.7, 47.1, 49.1, 49.5
See application file for complete search history.

(56) References Cited

U.S. PATENT DOCUMENTS

| | | | |
|---|---|---|---|
| 4,664,309 A | 5/1987 | Allen et al. | |
| 4,705,205 A * | 11/1987 | Allen | B23K 3/06 228/180.22 |
| 4,712,721 A | 12/1987 | Noel et al. | |
| 4,842,184 A | 6/1989 | Miller, Jr. | |
| 5,029,748 A | 7/1991 | Lauterbach et al. | |
| 5,040,717 A | 8/1991 | McGaffigan | |
| 5,497,938 A | 3/1996 | McMahon et al. | |
| 5,626,278 A | 5/1997 | Tang | |
| 5,695,109 A | 12/1997 | Chiang et al. | |
| 6,136,128 A | 10/2000 | Chung | |
| 6,276,596 B1 | 8/2001 | Gruber et al. | |
| 6,296,173 B2 | 10/2001 | Davis et al. | |
| 6,412,685 B2 | 7/2002 | Hertz et al. | |
| 6,955,285 B2 | 10/2005 | Nomoto et al. | |
| 9,108,262 B1 * | 8/2015 | Hart | H01L 21/4853 |
| 2009/0223710 A1 * | 9/2009 | Becker | H05K 3/4038 174/264 |
| 2009/0267227 A1 * | 10/2009 | Dando, III | B23K 3/0623 257/737 |
| 2014/0262498 A1 | 9/2014 | Hester et al. | |

* cited by examiner

*Primary Examiner* — Kiley Stoner
(74) *Attorney, Agent, or Firm* — Knobbe, Martens, Olson & Bear, LLP

(57) ABSTRACT

A disposable apparatus with a plurality of preloaded pins such as solder columns, micro-coil springs, or other cylindrically shaped metallic parts (solder columns, et al.) in an array pattern is provided for aligning and dispensing onto a column grid array (CGA) substrate. The apparatus includes a carrier plate with a pattern of holes that is covered by removable covers to retain, position and hold an array of solder columns, et al. Alignment features on the top of the carrier plate plugs into a jig-alignment fixture or frame that precisely positions the solder columns, et al. over a CGA substrate. After inverting (flipping over) the apparatus and jig-fixture or frame upside down, the payload of solder columns, et al. detaches and transfers by gravity onto a pattern of metal pads on the CGA substrate, without the use of vacuum or vibration.

21 Claims, 13 Drawing Sheets

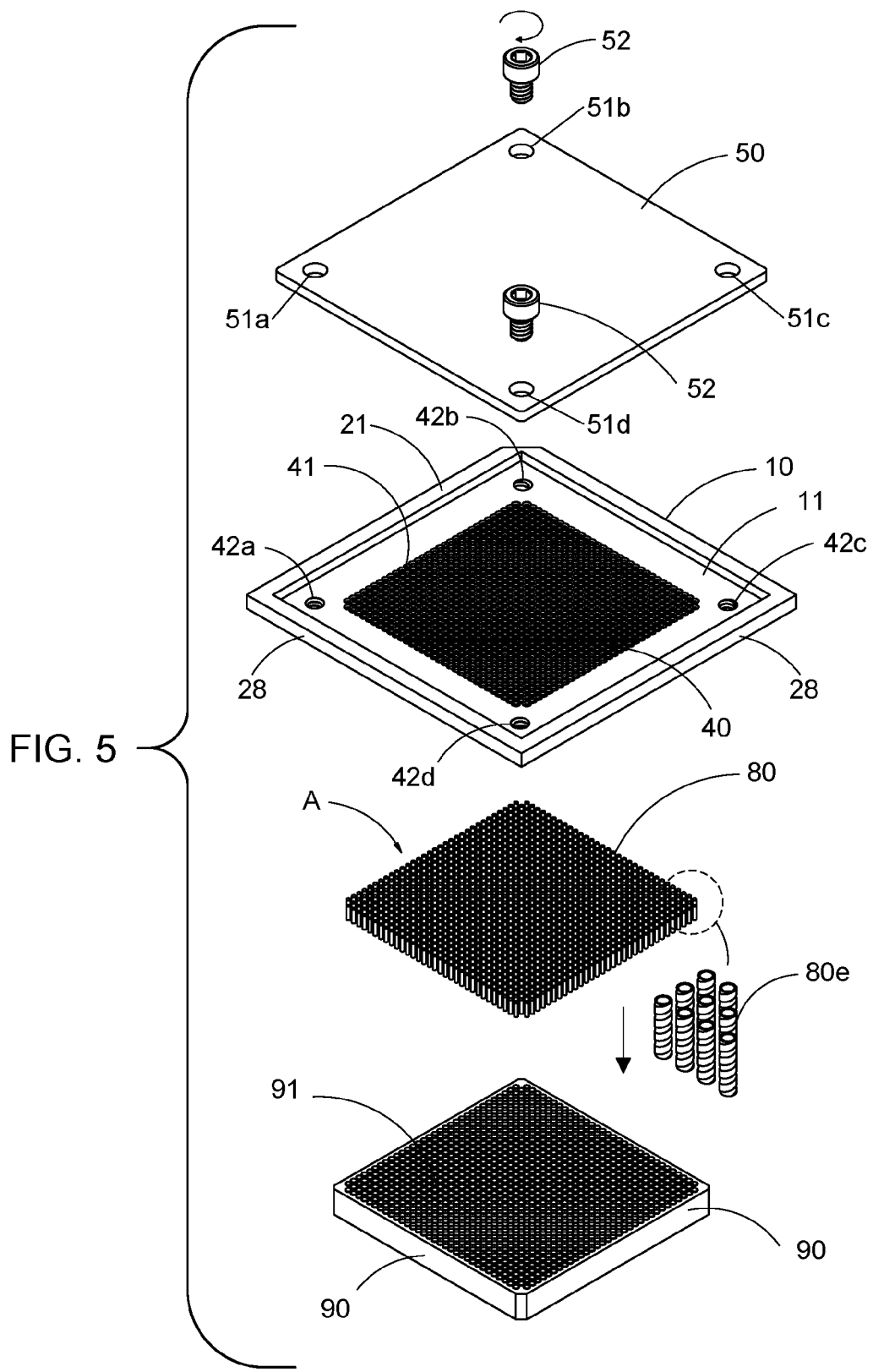

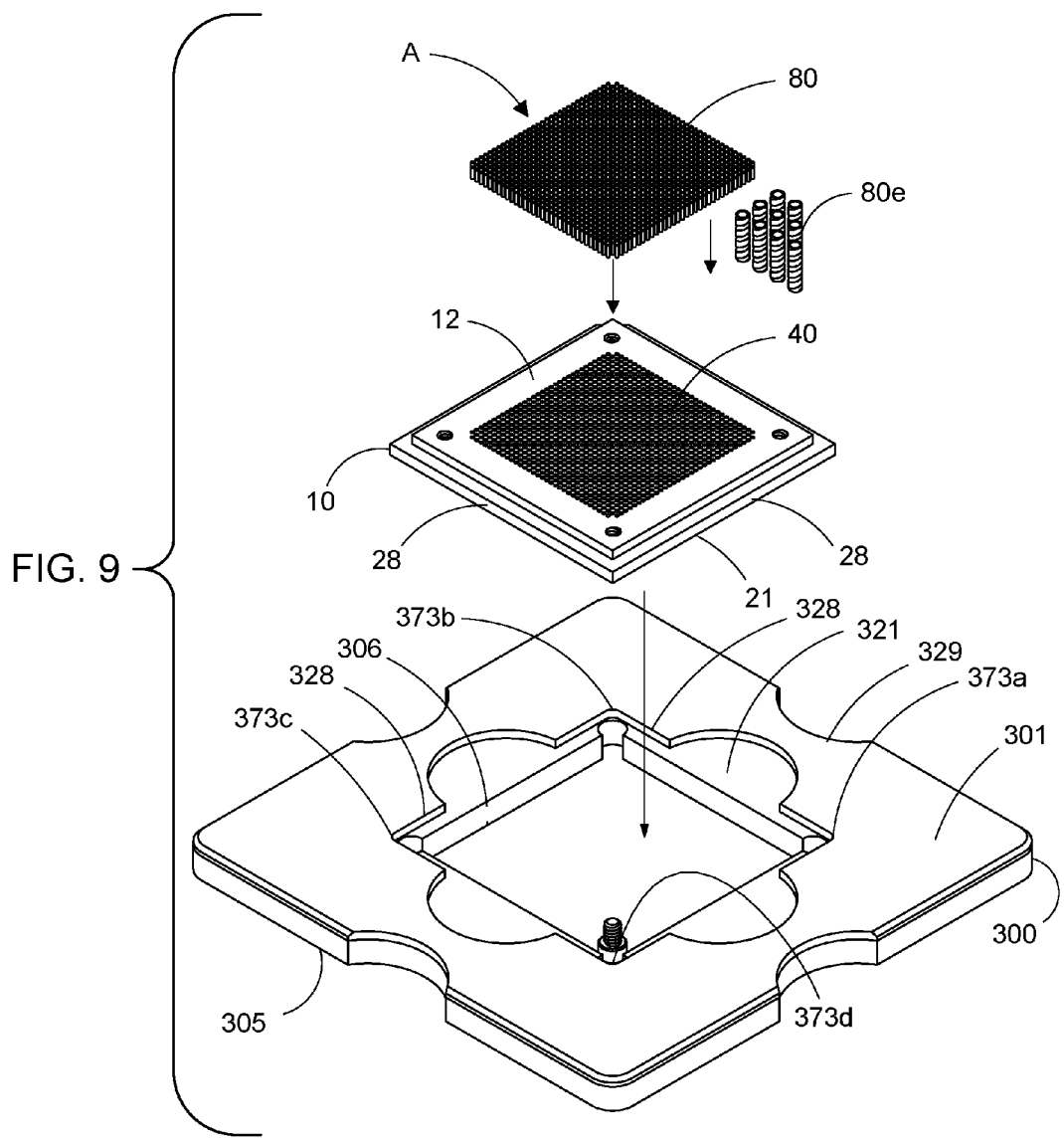

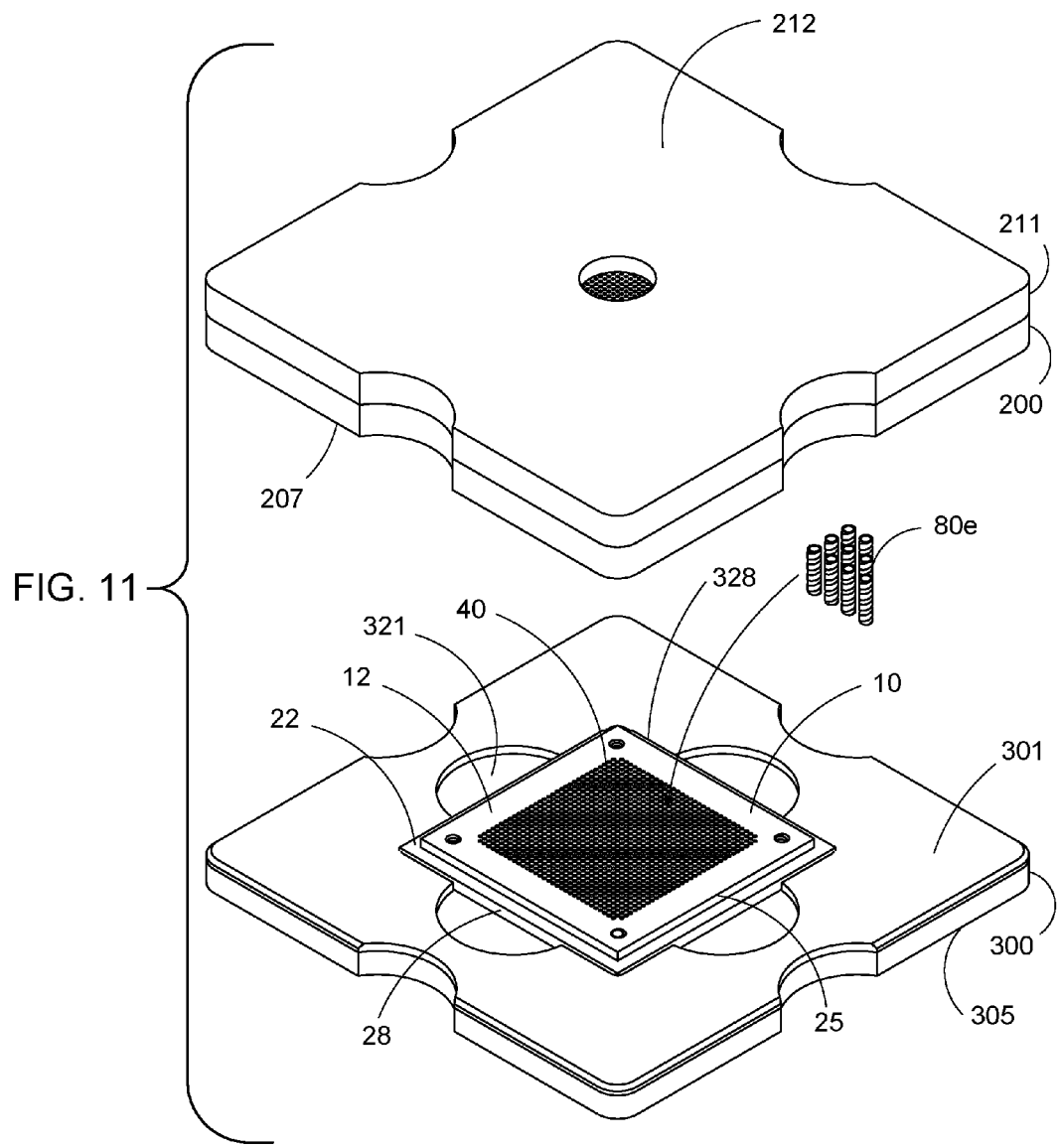

REFILLABLE APPARATUS FOR ALIGNING AND DEPOSITING SOLDER COLUMNS IN A COLUMN GRID ARRAY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present invention relates generally to column grid array (CGA) semiconductor packaging, and more particularly to an apparatus for aligning and depositing a plurality of electrical interconnect members, such as pins, solder columns, micro-coil springs, or other cylindrically shaped metallic parts in an array pattern on a ceramic or plastic substrate.

Description of the Related Art

Typically, an intermetallic connection is formed between a plurality of solder columns and the conductive pads on a land grid array (LGA) substrate. Initially, a layer of solder paste is applied to cover the array of conductive pads on the LGA. After heating, the solder paste reflows on the conductive pads causing an intermetallic connection between the solder columns and the conductive pads on the LGA. The LGA substrate material may consist of ceramic or plastic materials. After completion of the reflow process, the LGA with solder columns is known in the art as a column grid array (CGA) or ceramic column grid array (CCGA).

In general, the number of solder columns on a CGA device may range from 4 to 3000, or more, as the density of electronic devices and integrated circuit packages continues to increase.

An alternative to CGA column grid array devices is ball grid array (BGA) devices. BGA devices contain an array of solder spheres (balls) to provide electrical connections between the conductive pads on a BGA substrate and the printed circuit board (PCB). In the art, BGA substrates that are constructed of ceramic material (such as alumina or $Al_2O_3$) are known as a ceramic ball grid array (CBGA). Ceramic substrates are often required in harsh environments or when excessive heat and power is present.

However, one problem with BGA devices is that a substantial difference in the coefficient of thermal expansion (CTE) can exist between BGA substrates and the PCB board. The problem with CTE differences becomes more problematic when large size ceramic CBGA substrates are attached to PCB boards that are made of plastic glass-woven material such as FR-4, FR-5 or polyimide. Such differences in the coefficient of thermal expansion causes deformation of the solder spheres (solder balls) interconnecting a ceramic BGA device to a PCB board. Over time, the electrical connection between the solder ball and metal pad will break between large size ceramic BGA substrates and a plastic glass-woven PCB due to CTE mismatching issues.

The problem with CTE mismatch has been addressed by using cylindrical solder columns instead of solder spheres (solder balls) as the electrical interconnect between ceramic substrates and the plastic PCB boards. Taller cylindrically shaped solder columns are generally more compliant to better absorb CTE differential thermal expansion rates between the CGA and the PCB board. Wider solder columns are generally more structurally robust to support the load weight of heavy ceramic substrates. However, the maximum diameter of the solder column is normally constrained by the pitch (spacing) of the conductive pads on the CGA package as well as by the diameter of the conductive pads.

Traditionally, solder columns are cylindrically shaped and typically have a diameter of approximately 0.51 mm (0.020-inch) and a height of approximately 2.21 mm (0.087-inch). Solder columns may also be as small as 0.20 mm (0.008-inch) in diameter or more than 0.889 mm (0.035-inch) in diameter. Furthermore, the length of solder columns may be as short as 0.25 mm (0.010-inch) or as long as 3.81 mm (0.150-inch) or more.

The conductive pads on the LGA substrate are covered with a controlled thickness of solder paste before attaching a plurality of solder columns to the LGA substrate. Typically, solder paste consisting of low melting point tin-lead alloy, such as Sn63/Pb37, is preferred for applications within the fields of aerospace, military and defense industries. However, lead free solder paste alloys such as SAC305 (Sn96.5/Ag3.0/Cu0.5), or other Pb-free alloys, may be used for applications requiring lead-free materials.

Solder columns are typically made of high melting temperature solder such as Pb90/Sn10, Pb85/Sn15 or Pb80/Sn20. Solder columns may be wrapped with copper ribbon tape as disclosed in U.S. Pat. No. 4,664,309.

An alternative to solder columns is micro-coil springs that are typically made of beryllium copper (Be—Cu) alloy and electroplated with tin-lead solder (Sn60/Pb40) or other plating such as nickel-gold (Ni—Au) or Silver (Ag). Yet another alternative to solder columns are solid copper columns or other conductive materials.

Solder columns are generally vertically positioned perpendicularly onto a corresponding array of conductive pads on the LGA substrate. The substrate together with high temperature solder columns, or alternative pins and a layer of low temperature solder paste are then heated so that the solder paste is reflowed to make an intermetallic fillet connection between the solder columns and the LGA pads, without melting or damaging the solder columns. The completed package with attached solder columns is known in the art as a column grid array (CGA) or ceramic column grid array (CCGA) package.

A secondary procedure is required to mount the CGA package onto the PCB board. The process of connecting the CGA package to the PCB board requires the CGA to be reflowed again, without melting or collapsing the solder columns. A controlled layer of low temperature melting solder paste is applied to a corresponding plurality of contact pads on the PCB board. The CGA package is placed onto the solder paste covered pads on the PCB board. The PCB board along with one or a plurality of CGA packages (as well as other components) is heated and reflowed resulting in an intermetallic fillet that holds the CGA solder columns to the PCB board.

In the prior art, various methods and apparatuses have been utilized to mount cylindrically shaped solder columns into an array pattern by hand using tweezers or via vibration or with a vacuum pick-up tool.

In the prior art, methods using tweezers to place solder columns by hand are time consuming and require an operator with dexterity to perform many repeated steps. For example, it may require roughly one-hour to load 900 solder columns onto a CGA substrate by hand, assuming that a person using tweezers is able to pick-up, transfer and place one solder column every four seconds. In addition, in the prior art, a person using hand placement methods may result in errors as the operator often fails to complete the specified pattern.

In the prior art, methods to deliver interconnect members use vibration (e.g., require an inclined vibration machine with elongated alignment and a vacuum pick-up tool to position solder pins onto a CGA substrate package) or a sacrificial adhesive tacky tape layer in a carrier plate to retain and position an array of solder pins onto a CGA substrate package.

SUMMARY

Accordingly, there is a need for a simpler and more elegant system and method for aligning and dispensing electrical interconnect members (e.g., solder columns, micro-coil springs, conductive pins, etc.) onto LGA, CGA or CCGA substrates without the use of vacuum, vibration or adhesive tacky tape.

In accordance with one aspect of the invention, a refillable apparatus and method is provided for aligning and dispensing electrical interconnect members (e.g., solder columns, micro-coil springs, conductive pins, etc.) onto LGA, CGA or CCGA substrates under the force of gravity.

In accordance with another aspect of the invention, an apparatus and method is provided that significantly speeds up the process for dispensing electrical interconnect members (e.g., solder columns, micro-coil springs, conductive pins, etc.) onto LGA, CGA or CCGA substrate packages relative to the time it takes an operator to manually insert solder columns using tweezers onto a ceramic or plastic LGA, CGA or CCGA substrate packages.

In accordance with another aspect of the invention, an apparatus and method is provided that accommodates a variety of different shapes and sizes of interconnect members (e.g., solder columns, micro-coil springs, conductive pins, etc.) without the need to use tweezers, vibration machinery, vacuum pick-up tools or sacrificial tacky adhesive tape.

In accordance with another aspect of the invention, an apparatus and method is provided that minimizes errors caused by an operator incorrectly placing interconnect members (e.g., solder columns, et al.) or failing to insert said interconnect member onto a CGA pad that requires one.

In accordance with another aspect of the invention, an apparatus and method is provided that holds, transports and feeds or delivers interconnect members (e.g., solder columns, et al.) onto a LGA, CGA or CCGA substrate package that is low cost and refillable.

In accordance with another aspect of the invention, an apparatus comprising a dispensing apparatus and method is provided. An LGA with a layer of solder paste covering the conductive pads of the LGA is placed inside the receiving apparatus. A plastic plate with a plurality of cylindrical holes (silos) is loaded with a plurality of electrical interconnect members (e.g., solder columns, micro-coil springs, or other types of cylindrical pins, etc.). The interconnect members (e.g., solder columns, etc.) are held in place in the silos (cylindrical holes) of the apparatus. A removable cover plate is fastened to the top side of the apparatus. A removable retention plate is fastened to the lower side of the apparatus. The interconnect members are held and protected inside the plurality of holes in the apparatus by the cover and retentions plates until released by removing the top cover plate. After the top cover plate is removed from the apparatus, the apparatus (holding the interconnect members) is inverted 180 degrees (i.e., flipped over upside down). The array of interconnect members are transferred by gravity (e.g., dropped) onto a plurality of corresponding pads (e.g., a corresponding pattern of pads) on a ceramic or plastic LGA, CGA or CCGA substrate without the use of vacuum or vibration.

In accordance with another aspect of the invention, a system for aligning, dispensing and depositing a plurality of interconnect members onto a column grid array substrate package is provided. The system comprises a dispensing apparatus body having a peripheral rim and an alignment carrier plate protruding (e.g., male) relative to said peripheral rim, the alignment carrier plate having a plurality of holes extending therethrough from a top surface of the plate to a bottom surface of the plate and arranged in a pattern. The alignment carrier plate in the receiving apparatus has a plurality of holes extending therethrough from a top surface of the plate to a bottom surface of the plate and arranged in a pattern. The protruding male side of the apparatus seats into the recessed (e.g., female receptacle) of a receiving apparatus which holds the LGA. The system also comprises a cover plate having a non-adhesive surface in contact with the top protruding (e.g., male) surface of the apparatus such that the plate covers the plurality of holes in the alignment carrier plate, said non-adhesive cover plate prevents the plurality of cylindrically shaped interconnect members from escaping the plurality of holes until removed by the operator. The top cover is fastened to the top surface with one or more fasteners, such as threaded screws. The top cover is removable (detachable) from the top surface by removing the fasteners from the apparatus. The receiving apparatus is placed over the dispensing apparatus (holding a LGA) and the system is flipped over (turned upside down). After turning the apparatus upside down (flipping over), the plurality of interconnect members drop under the force of gravity onto an array pattern of metallic pads of a column grid array substrate without the use of vibration or vacuum. The system also comprises a frame for holding the apparatus on a table to aid in removing the top cover plate, and positioning the apparatus for loading the receiving apparatus.

In accordance with another aspect of the invention, an apparatus for aligning, dispensing and depositing a plurality of interconnect members onto a column grid array (CGA) substrate package is provided. The apparatus comprises a body having a peripheral rim and an alignment carrier plate protruding (e.g., male) relative to said peripheral rim. The alignment carrier plate has a plurality of holes extending therethrough from a top surface of the plate to a bottom surface of the plate and arranged in a pattern. The top surface of the alignment carrier plate is removably coverable with a non-adhesive cover plate having a parallel surface such that the cover plate removably covers the plurality of holes in the alignment carrier plate. The top cover plate on the apparatus is manually detachable from the top surface of the alignment carrier plate to release the plurality of interconnect members such that the plurality of interconnect members drop under the force of gravity from the alignment carrier plate when inverted (e.g., flipped) upside down.

These and other objects, features and advantages of the present invention will become more apparent from the detailed description of the preferred embodiment when read in conjunction with the drawings.

In accordance with one aspect, a system for aligning, dispensing and depositing a plurality of interconnect members onto a column grid array substrate package is provided. The system comprises a body having a peripheral rim and an alignment carrier plate protruding relative to said peripheral rim, the alignment carrier plate having a plurality of holes extending therethrough from a top surface of the alignment carrier plate to a bottom surface of the alignment carrier plate and arranged in a pattern. The system also comprises a cover plate without adhesive removably coupleable with the top surface and a retention plate without adhesive removably coupleable with the bottom surface of the alignment carrier plate such that the cover and retention plates removably covers the plurality of holes in the alignment carrier plate, said plates not attached to either end of a plurality of cylindrically shaped interconnect members releasably disposed in the plurality of holes, the cover plate manually detachable from the top surface of the alignment carrier plate to release the plurality of interconnect members when inverted upside down such that the plurality of interconnect members drop under the force of gravity onto an array pattern of metallic pads of a column grid array substrate without the use of vibration or vacuum. The system also comprises a frame for aligning said carrier plate over said column grid array substrate.

In accordance with another aspect, an apparatus for aligning, dispensing and depositing a plurality of cylindrically shaped interconnect members onto column grid array substrate package is provided. The apparatus comprises a body having a peripheral rim and an alignment carrier plate recessed relative to said peripheral rim, the alignment carrier plate having a plurality of holes extending therethrough from a top surface of the plate to a bottom surface of the plate and arranged in a pattern, the top surface removably coverable with one or more cover plates having a non-adhesive surface such that the cover plate removably covers the plurality of holes in the alignment carrier plate, said non-adhesive surface removably restrains the plurality of cylindrically shaped interconnect members releasably disposed in the plurality of holes, the layer manually detachable from the top surface of the alignment carrier plate to release the plurality of interconnect members such that the plurality of interconnect members drop under the force of gravity from the alignment carrier plate when inverted upside down.

BRIEF DESCRIPTION OF THE DRAWINGS

FIG. 5 is an exploded view of the inverted (upside down) apparatus of FIG. 1A (shown for clarity without the top cover plate), the bottom retention plate, alignment plate with a plurality of holes, an array of interconnect members dropping via gravity feed onto a CCGA substrate with a plurality of metalized pads to receive the interconnect members.

FIG. 9 is an exploded view of the apparatus of FIG. 6B (prior to being loaded with an array of interconnect members) and a receiving (e.g., female receptacle) plastic or metal frame jig-fixture to hold and align the apparatus upright before insertion into the frame.

FIG. 11 is an exploded view of a frame apparatus positioned above the dispensing apparatus seated in the plastic frame fixture of FIG. 10A.

DETAILED DESCRIPTION

Figure 1A:
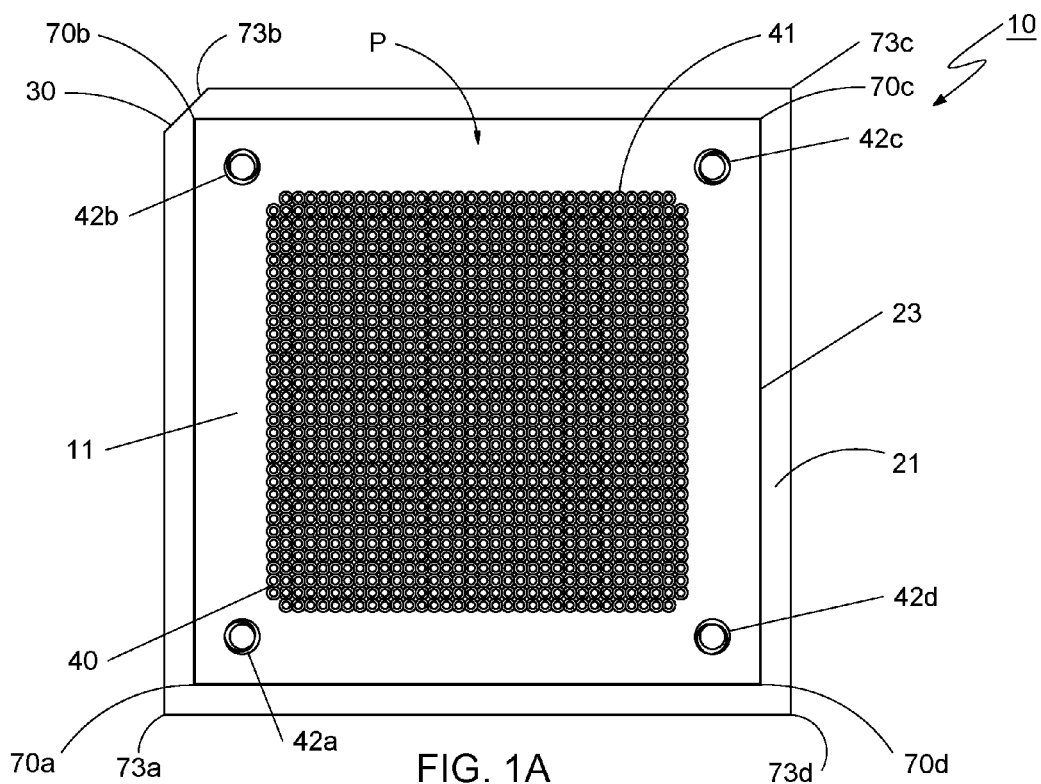
FIG. 1A is a top view and FIG. 1B is a top perspective view of one embodiment of a dispensing apparatus with an array of holes that house, position and align a plurality of interconnect members prior to placement onto a CCGA substrate.
Figure 1B:
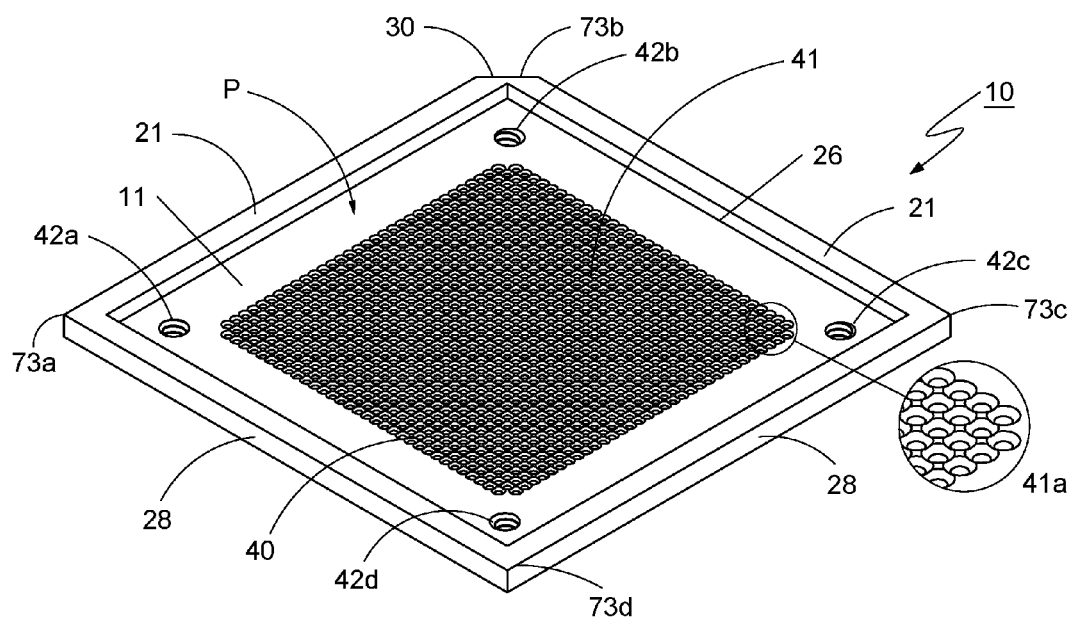

Referring first to FIGS. 1A and 1B, is an apparatus (shown for clarity without the retention plate 50 in FIG. 2B, FIG. 4, FIG. 5 and FIG. 7), generally designated at 10, that can hold, align and dispense one or more (e.g., a plurality of) electrical interconnect members 80 in FIG. 4, FIG. 5, FIG. 7 and FIG. 9 in any desired array pattern. The apparatus 10 can be shaped like a tray or carrier plate with a plurality (e.g., an array) of holes 40 in FIGS. 1A, 1B, FIGS. 2A, 2B, FIGS. 3A, 3B, FIG. 4, FIG. 5, FIGS. 6A, 6B, FIG. 7, FIG. 9, FIG. 10 and FIG. 11 that extend through an alignment carrier plate P of the tray (e.g., extend through from surface 11 to surface 12 of the alignment carrier plate P). The apparatus of carrier plate 10 can have a square shape. In other embodiments, the apparatus or carrier plate 10 can have other suitable shapes (e.g., rectangular, etc.). The one or more electrical interconnect members 80 can be solder columns, micro-coil springs, pins or other suitable generally cylindrical members that are releasably disposed in the holes 40 of the apparatus 10, as discussed further below.

Figure 2A:
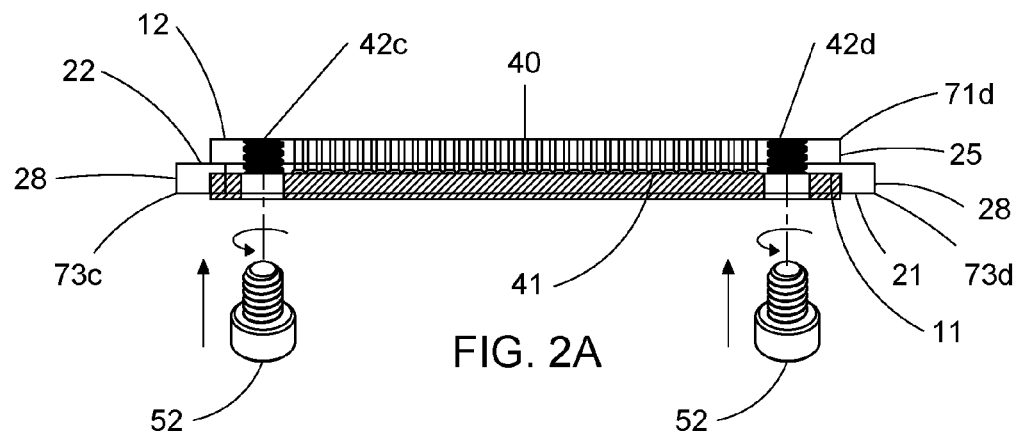
FIG. 2A is a cross-sectional side view of the apparatus of FIG. 1A.
Figure 2B:
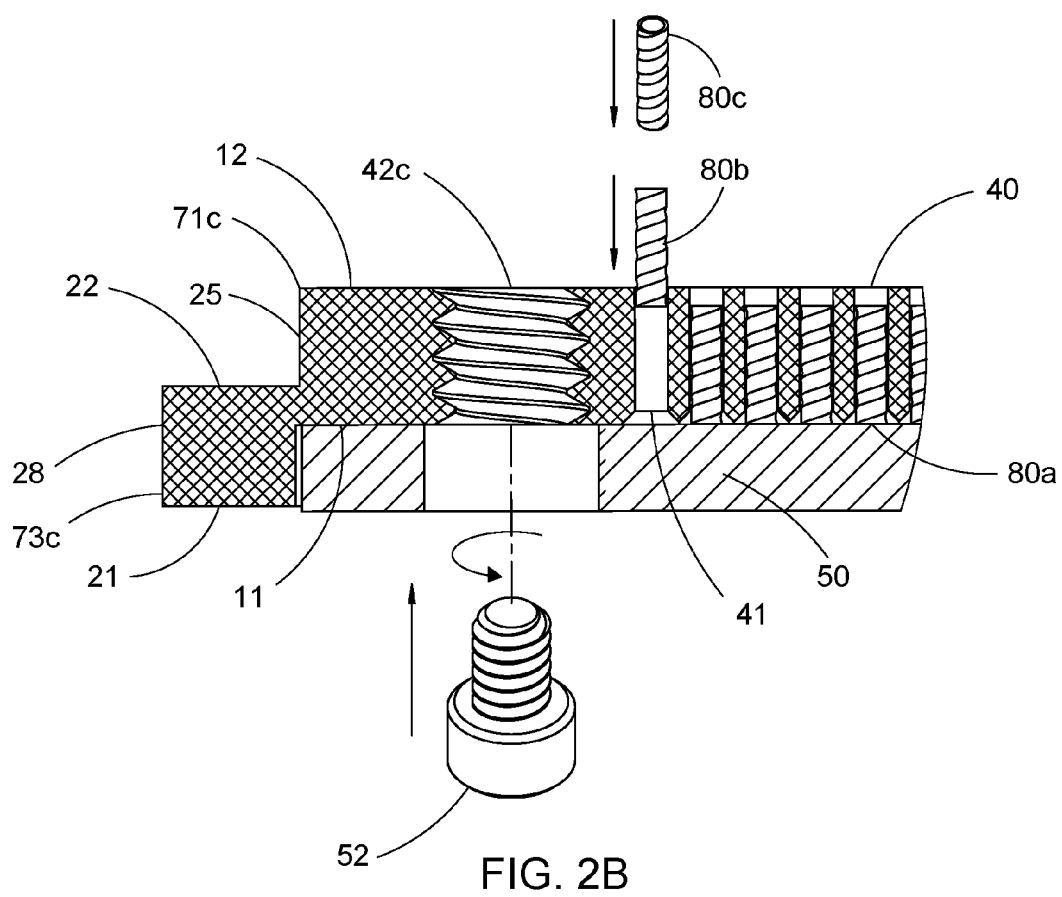
FIG. 2B is a partial enlarged cross-sectional side view of the apparatus of FIG. 1A showing details of a plurality of interconnect members (e.g., solder columns) seated in the silos (cylindrical holes) of the dispensing apparatus in the upright resting position as well as an interconnect member being placed into a silo. The interconnect members (e.g., solder columns) are prevented from escaping the exit end of the silo by a removable retention plate.
Figure 3A:
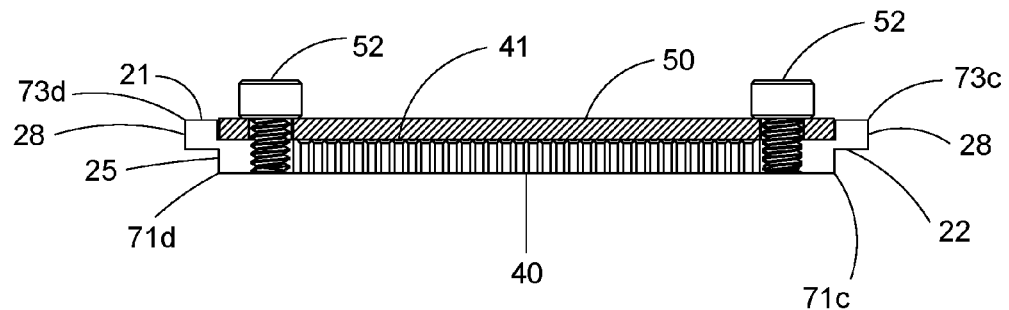
FIG. 3A is an inverted (e.g., positioned upside down) cross-sectional side view of the apparatus of FIG. 2A.
Figure 3B:
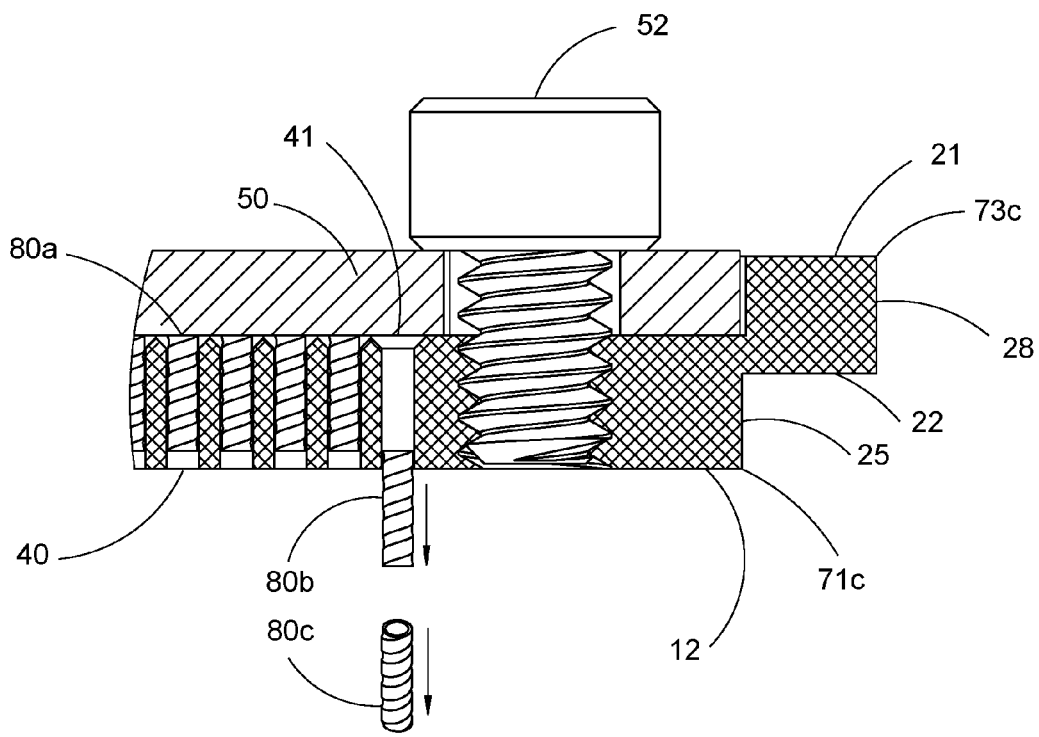
FIG. 3B is an inverted (positioned upside down) of the enlarged sectional side view of the apparatus of FIG. 2B showing details of a plurality of interconnect members (e.g., solder columns) dropping via gravity feed after removing the cover plate and inverting the apparatus upside down.
Figure 4:
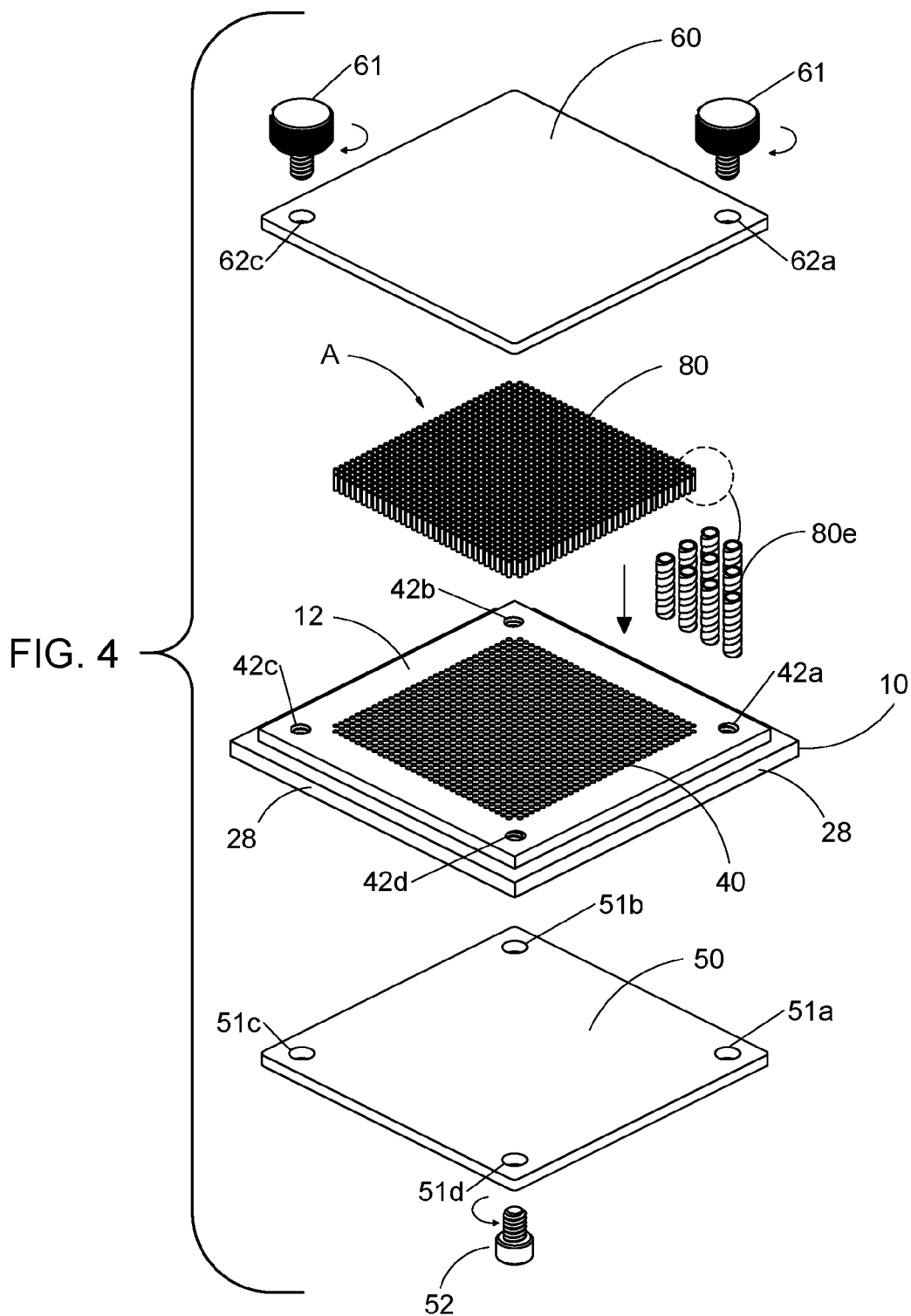
FIG. 4 is an exploded view of the apparatus of FIG. 1A with the top cover plate, bottom retention plate, alignment plate with a plurality of holes, an array of interconnect members.
Figure 6A:
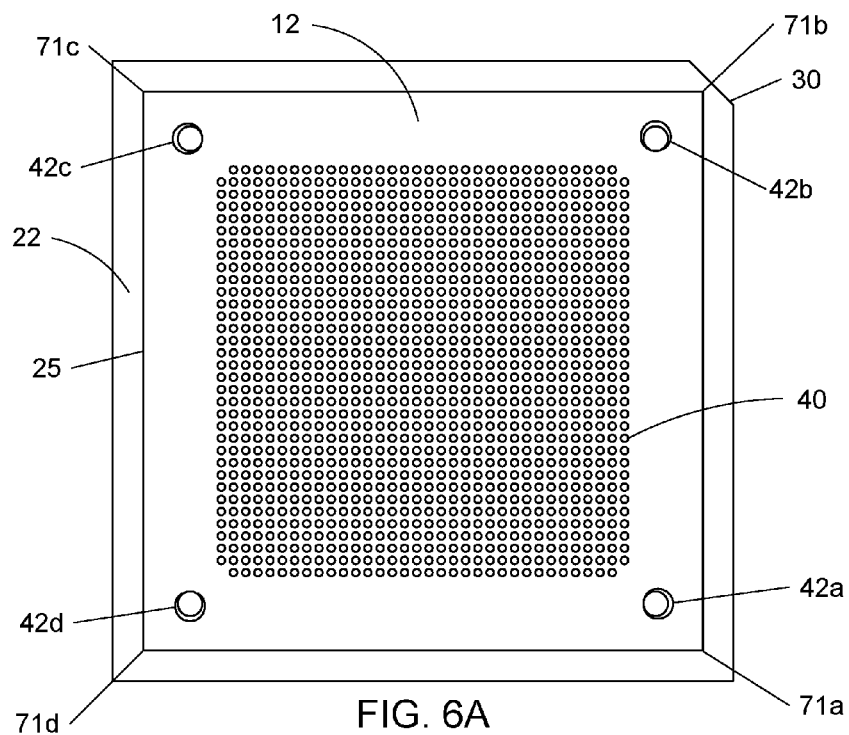
FIG. 6A is a bottom view and FIG. 6B is a bottom perspective view of one embodiment of a dispensing apparatus with an array of holes that house, position and align a plurality of interconnect members prior to placement onto a CCGA substrate.
Figure 6B:
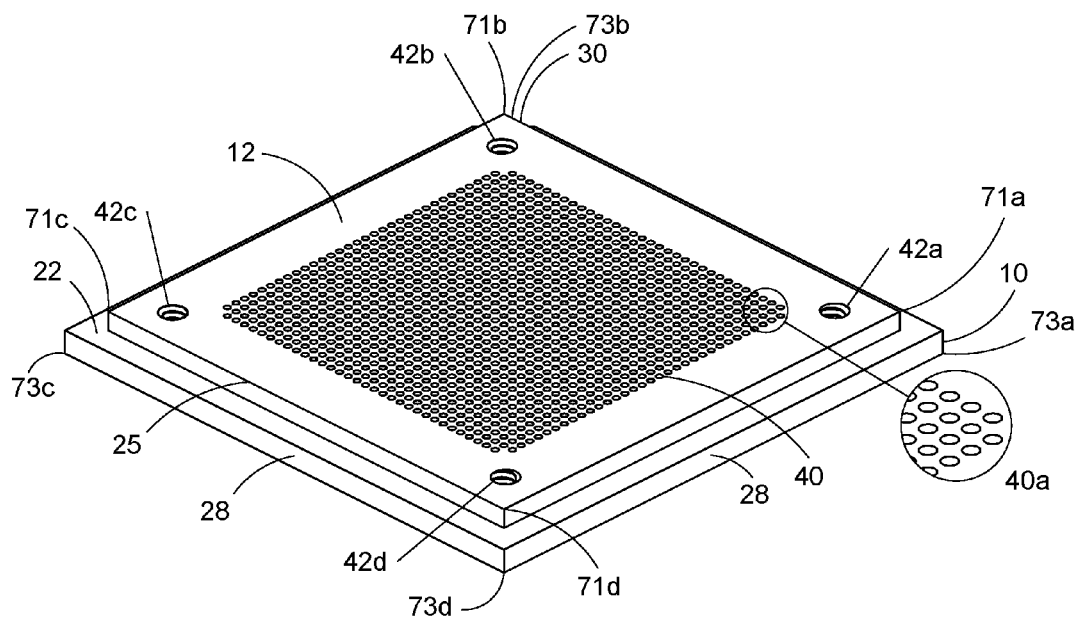
Figure 7:
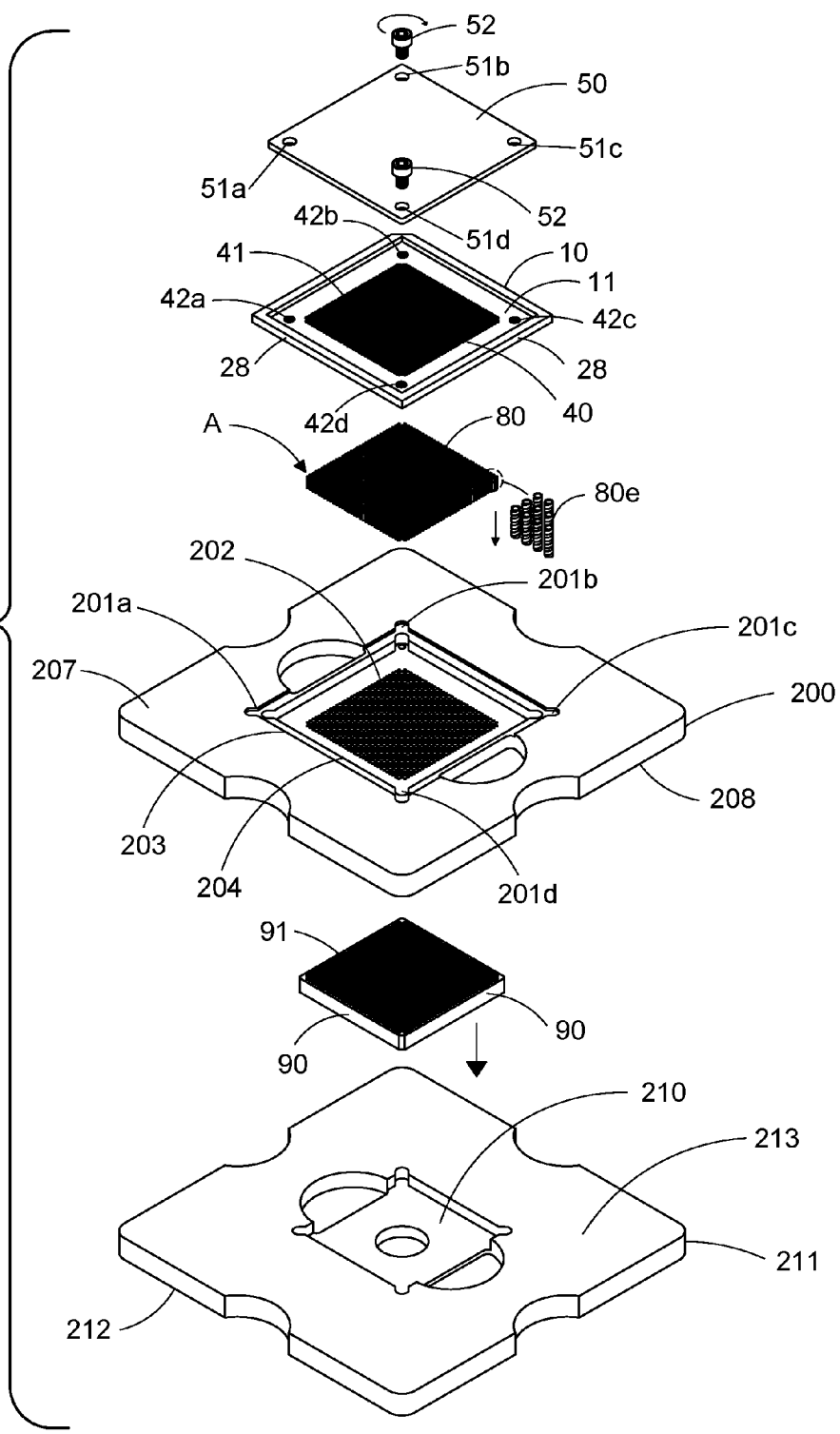
FIG. 7 is an exploded view of the inverted (upside down) apparatus of FIG. 1A (shown for clarity without the top cover plate), the bottom retention plate, alignment plate with a plurality of holes, an array of interconnect members dropping via gravity feed onto the receiving (e.g., female receptacle) frame apparatus with a plurality of holes, LGA substrate with a plurality of metalized pads to receive the interconnect members and a base jig-fixture with pocket that holds said LGA substrate.

FIGS. 2A, 2B, FIGS. 3A, 3B, FIG. 4, FIG. 5, FIG. 7, FIG. 10B, FIG. 12B and FIG. 13 show the retention plate 50 that can be removably coupled to the apparatus 10 by one or more fasteners 52 shown in FIGS. 2A, 2B, FIGS. 3A, 3B, FIG. 4, FIG. 5, FIG. 7, FIG. 10B, FIG. 12B, and FIG. 13. Non-threaded holes 51b and 51d of retention plate 50 shown in FIG. 4, FIG. 5, FIG. 7 and FIG. 13 are larger than the diameter of the threaded fasteners 52 to provide a path for one or more fastener 52 to removably couple with corresponding threaded-holes 42b and 42d in apparatus 10 shown in FIG. 4, FIG. 5, FIGS. 6A, 6B and FIG. 7. Non-threaded holes 51a and 51c of retention plate 50 shown in FIG. 4, FIG. 5, FIG. 7 and FIG. 13 are larger than the diameter of the threaded fasteners 61 shown in FIG. 4 to provide an opening (e.g., silo) for the free-end of one or more fasteners 61, removably coupled to apparatus 10 and protruding beyond the underside of apparatus 10 into retention plate 50. The parallel surface of retention plate 50 prevents the plurality of electrical interconnect members 80, as shown in FIGS. 2A, 2B and FIG. 7 from exiting side 11 of apparatus 10 while positioned in one or more holes 40. A cover plate 60 shown in FIG. 4 can be removably coupled to apparatus 10 by one or more fasteners 61 through corresponding threaded-holes 42a and 42c. Non-threaded holes 62a and 62c of cover plate 60 shown in FIG. 4 provide a path for fastener 61 to screw into threaded holes 42a and 42c in apparatus 10. The parallel surface of 60 prevents the plurality of electrical interconnect members 80, as shown in FIG. 4 from exiting side 12 of apparatus 10 while positioned in one or more holes 40 of the apparatus 10.

The one or more interconnect members 80 can be arranged in an array A shown in FIG. 4, FIG. 5, FIG. 7 and FIG. 9. The one or more interconnect members 80 can drop and fall from the apparatus 10 via (e.g., solely under the force of) gravity after the cover plate 60 is removed from a planar surface 12 of the tray as shown in FIG. 4 after apparatus 10 is inverted upside down as shown in FIG. 3B, FIG. 5 and FIG. 7.

Interconnect member 80c and 80b shown in FIG. 2B is one or more solder columns depositing (e.g. loading) into side 12 in the tray of apparatus 10. Interconnect member 80a shown in FIG. 2B is one or more solder columns resting in holes 40, can be prevented from exiting side 11 by retention plate 50. Interconnect member 80a shown in FIG. 3B is one or more solder columns positioned in holes 40 prior to exiting (e.g., dropping) apparatus 10 through side 12. Interconnect member 80b and 80c shown in FIG. 3B is one or more solder columns exiting (e.g. dropping) from side 12 of the tray (carrier plate) after cover plate 60 has been removed from apparatus 10 and inverting (e.g., flipping) apparatus 10 upside down. The retention plate 50 can be a transparent or translucent material so that the operator can visually see that all interconnect members 80 have dropped and fallen under the force of gravity after apparatus 10 is inverted upside down as shown in FIG. 5, FIG. 7, FIG. 12B and FIG. 13. Retainer plate 50 can be removed by unscrewing all fasteners 52 and using a tool with one or more pointed probes, or other mechanisms, to dislodge one or more stuck interconnect members 80. Interconnect member 80e is a solder column shown in FIG. 4, FIG. 5, FIG. 7, FIG. 9 and FIG. 11 in a perspective view outside of the tray of the apparatus 10. The array pattern of interconnect members (e.g., solder columns) 80 is shown dropping onto a pattern of corresponding metallic pads 91 on a top surface of a CCGA substrate 90 in FIG. 5 and FIG. 7.

As shown in FIGS. 1A, 1B, FIGS. 2A, 2B, FIGS. 3A, 3B, FIG. 4, FIG. 5, FIGS. 6A, 6B, FIG. 7, FIG. 9, FIG. 10A and FIG. 11, a pattern array of holes 40 may be arranged in any desired pattern such as an even number matrix (e.g., 2×2 or more than 42×42) or in an odd number matrix (e.g., 3×3 or more than 41×41). The center-line of the tray apparatus 10 intersects between the array of pattern holes 40 of an even numbered array (e.g., between rows of holes 40 in an even numbered array). The center-line of the tray apparatus 10 intersects through the array pattern of holes 40 of an odd numbered array (e.g., intersects a row of holes 40 in an odd numbered array).

The array pattern of non-countersink holes or apertures 40 and 40a shown in FIG. 6B on the surface of side 12 can include a plurality of countersink holes or apertures 41 and 41a formed on planar surface 11 in the apparatus 10 shown in FIG. 1B, which can include a refillable alignment carrier plate P through which the plurality of holes 41 extend. The plurality of holes 41 can be arranged in any desired array pattern 40 for removably housing a plurality of interconnect members 80, such as solder columns. The four corners 70a, 70b, 70c and 70d in FIG. 1A form the perimeter boundary for retention plate 50 to seat onto the parallel surface of side 11 of tray apparatus 10. As shown in FIGS. 3A-3B, the retention plate 50 can extend into the recessed opening defined by the sidewalls 26 of a peripheral frame that protrudes above the surface 11. Optionally, the retention plate 50 can sit in said recessed opening so that surface of the plate 50 is substantially flush with a surface of the peripheral frame 21 of the apparatus 10.

Figure 8A:
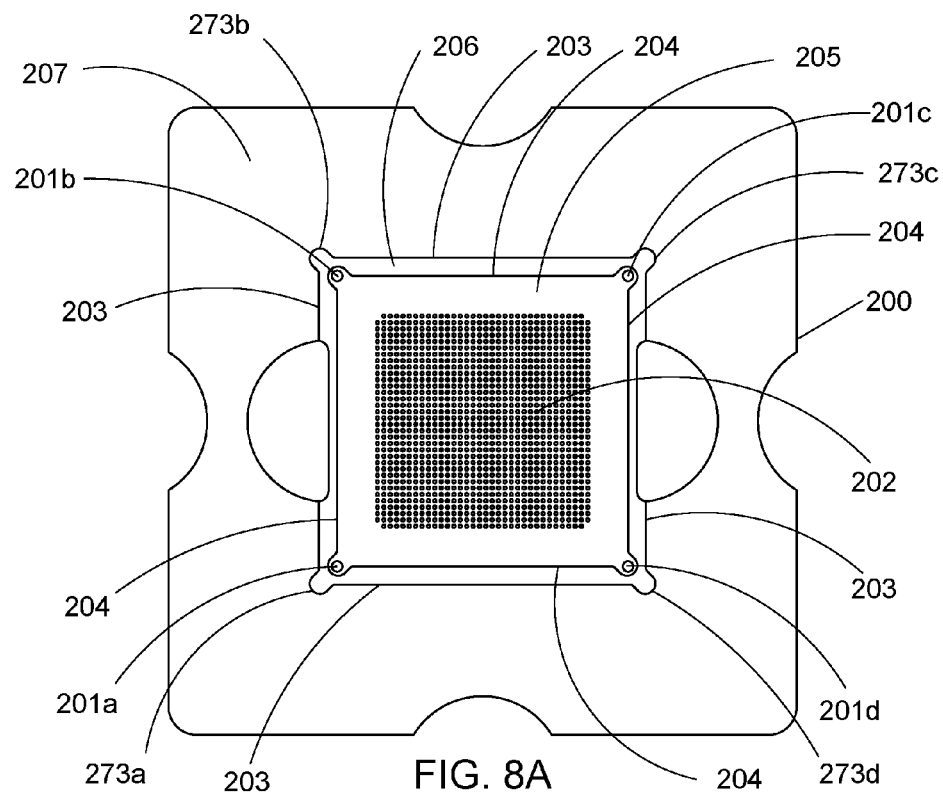
FIG. 8A is a top view and FIG. 8B is a top perspective view of the receiving (e.g., female receptacle) alignment frame apparatus with a plurality of holes (e.g., silos) to capture an array of interconnect members dropping via gravity feed from the apparatus of FIG. 1B.
Figure 8B:
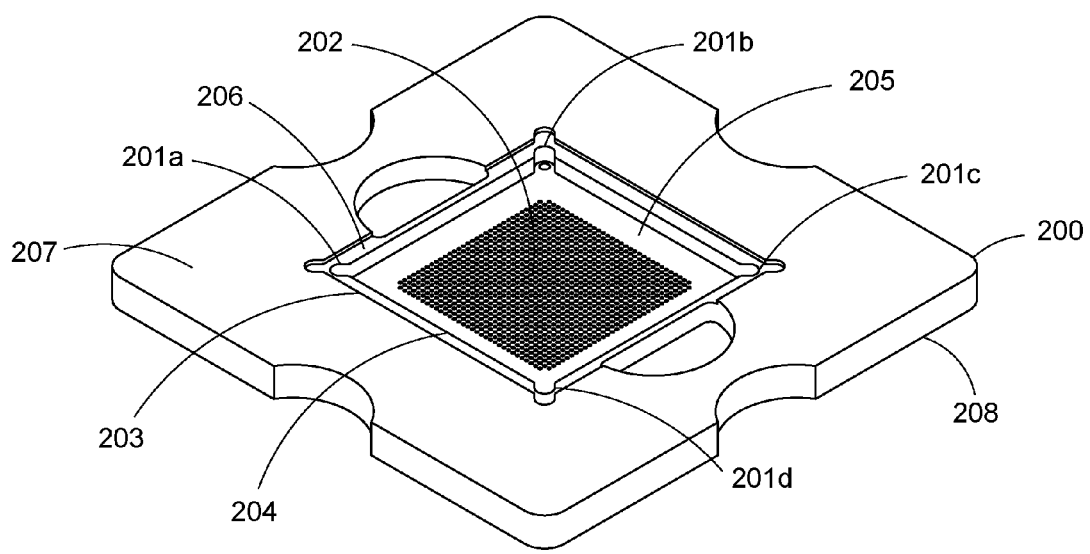
Figure 12A:
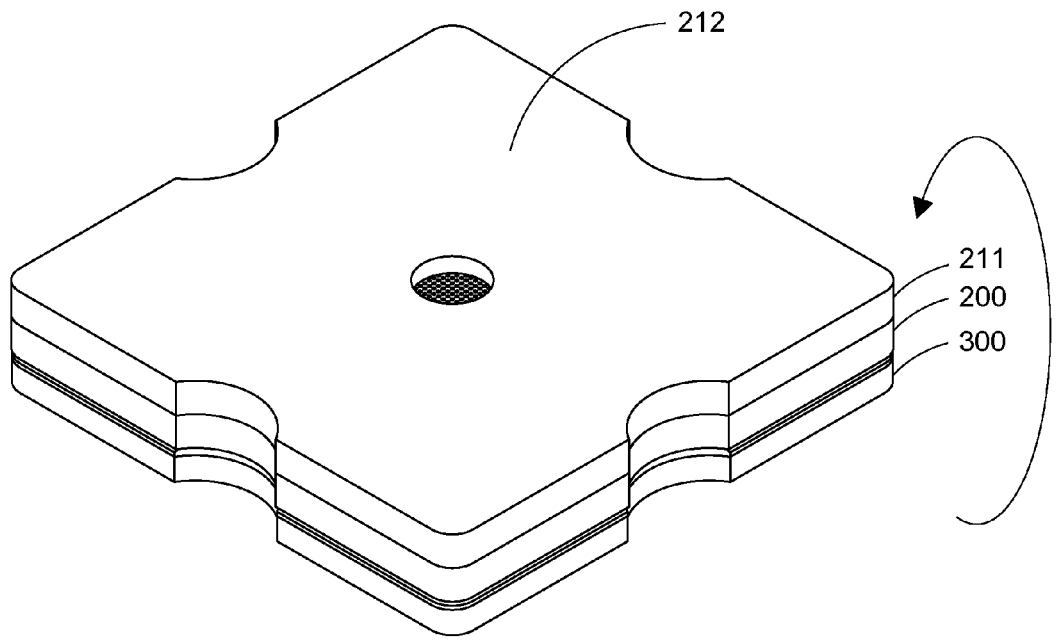
FIG. 12A is a bottom perspective view of an inverted alignment frame apparatus placed on top of the dispensing apparatus seated in the plastic or metal frame fixture of FIG. 10A.
Figure 12B:
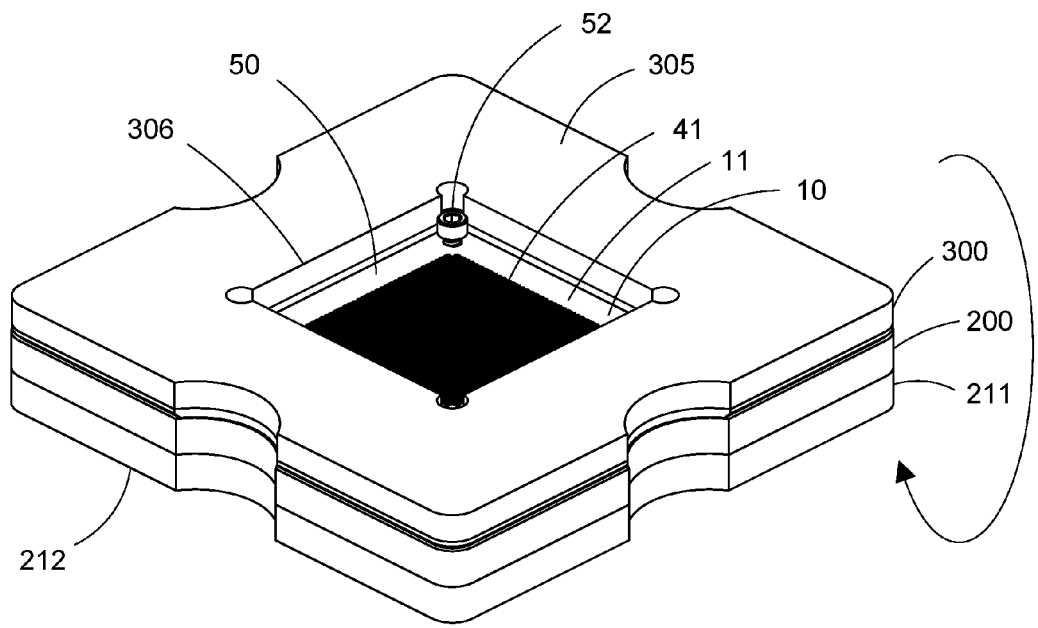
FIG. 12B is a top perspective view of FIG. 12A re-inverted (e.g., flipped over) right side up.

An alignment frame (e.g., graphite alignment frame) can include two jig-fixtures plates 200 and 211 as discussed further below. The top plate 200 is shown in FIG. 7, FIGS. 8A, 8B, FIG. 11, FIGS. 12A, 12B, and FIG. 13. The top surface 207 of the top plate 200 is shown in FIG. 7, FIGS. 8A, 8B and FIG. 13. The bottom surface 208 of the top plate 200 is shown in FIG. 7 and FIG. 8B. The base plate 211 is shown in FIG. 7, FIG. 11, FIGS. 12A, 12B and FIG. 13. The top surface 213 of the base plate 211 is shown in FIG. 7. The bottom surface 212 of the base plate 211 is shown in FIG. 7 and FIGS. 12A, 12B. The bottom side 208 of the top plate 200 is removably coupled to the top side 213 of the base plate 211 shown in FIG. 7. The four corners 71a, 71b, 71c and 71d as well as the four side walls 25 shown in FIGS. 2A, 2B, FIGS. 3A, 3B and FIGS. 6A, 6B form the perimeter boundary of an alignment feature on side 12 of tray apparatus 10 that inserts into the four wall receiving (e.g., female) receptacle 204 of the frame 200 shown in FIG. 7 and FIGS. 8A, 8B. The parallel surface 12 of tray apparatus 10 rests on the parallel surface 205 of the receptacle of frame 200 shown in FIGS. 8A, 8B. The four corners 73a, 73b, 73c and 73c as well as the four walls 28 form another perimeter boundary alignment feature on tray apparatus 10 as shown in FIGS. 1A, 1B, FIGS. 2A, 2B, FIGS. 3A, 3B, FIG. 4, FIG. 5, FIG. 6B, FIG. 7 and FIG. 9 that inserts into the four inside walls 203 of receiving (e.g., female receptacle) frame 200 shown in FIG. 7 and FIGS. 8A, 8B. The four ledges 22 of tray apparatus 10 shown in FIGS. 2A, 2B, FIGS. 3A, 3B, FIGS. 6A, 6B, FIGS. 10A, 10B, and FIG. 11 rests on the parallel surface of the four ledges 206 of frame 200 shown in FIGS. 8A, 8B. The plurality of holes 202 on surface 205 of the receiving member (e.g., female receptacle) is recessed below the surface 207 of the top frame 200 shown in FIGS. 8A, 8B, and recessed below the four ledges 206. The bottom side 212 of the base 211 is shown in FIG. 7, FIG. 11 and FIGS. 12A, 12B.

Figure 10A:
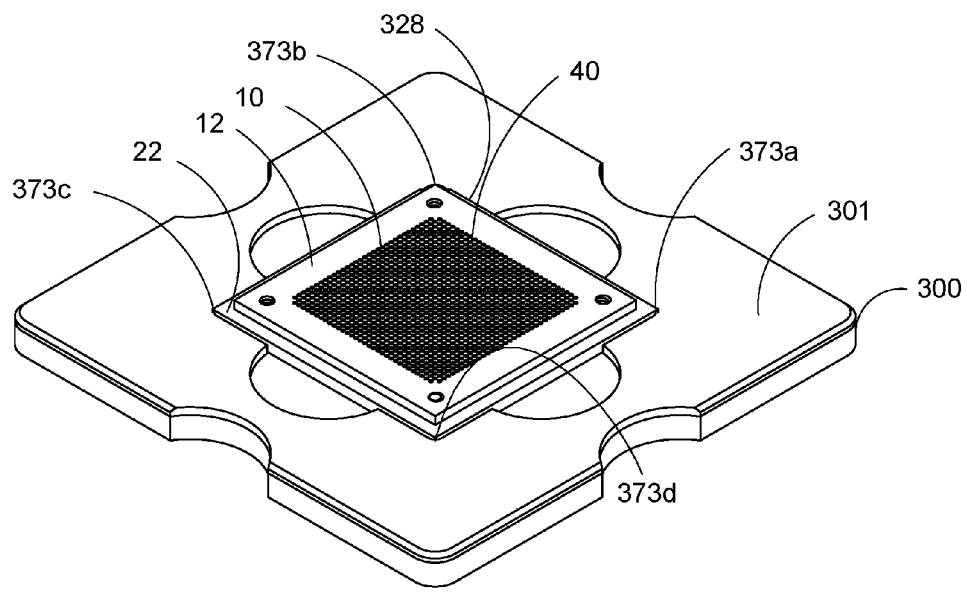
FIG. 10A is a top perspective view of the dispensing apparatus of FIG. 6B seated into the receiving (e.g., female receptacle) plastic of metal alignment frame.
Figure 10B:
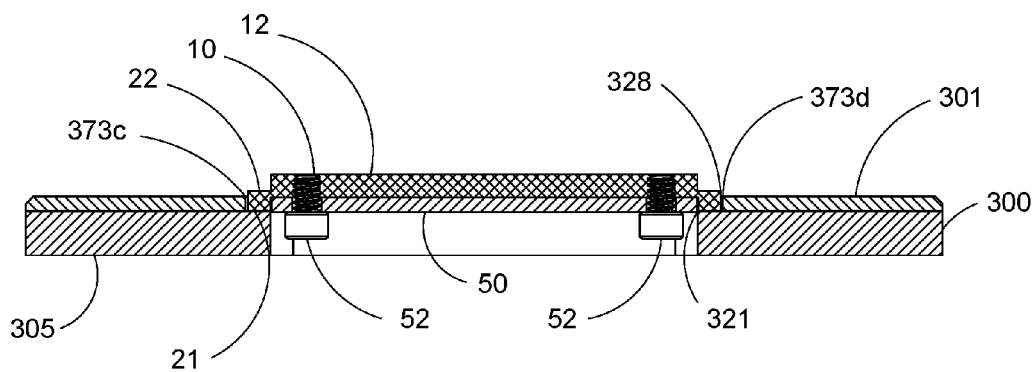
FIG. 10B is a cross-sectional side view of the dispensing apparatus seated in the receiving (e.g.; female receptacle) plastic or metal frame jig-fixture of FIG. 10A.

A jig-fixture consisting of plastic, metal or other material 300 forms an insertion alignment frame shown in FIG. 9, FIGS. 10A, 10B, FIG. 11 and FIG. 13. The four corners 373a, 373b, 373c and 373d on the top side of the insertion alignment frame 300 as well as the eight side walls 328 shown in FIG. 9 and FIGS. 10A, 10B form the perimeter boundary of an alignment feature on the insertion alignment frame 300. The receiving receptacle perimeter boundaries on surface 301 of the insertion alignment frame 300 are slightly larger than the outline of perimeter 28 of apparatus 10 to permit apparatus 10 to enter the alignment pocket (e.g., female receptacle) on the top side of 300. The perimeter four walls 306 on insertion alignment frame 300 is slightly smaller than the outline perimeter 28 of apparatus 10, allowing the four perimeter ledges 22 of apparatus 10 to rest on the shoulder 321 of the insertion alignment frame 300 without falling out as shown in FIG. 9 and FIG. 10B. The level of ledge 321 is lower than (e.g., recessed relative to) the surface 301 on insertion alignment frame 300 so that after inserting apparatus 10 into the pocket (e.g., female receptacle) of 300, substantially all of wall 25 and a portion of wall 28 of apparatus 10 will protrude beyond the surface 301 (see FIGS. 6B and 10B). After insertion of apparatus 10 into the pocket formed by walls 328 on the insertion alignment frame 300, apparatus 10 will be in the upright position with side 12 of apparatus 10 facing upwards. One such embodiment is used when removably coupling the inserting alignment frame 300 into the receiving receptacle of plate 200. The parallel surface of 207 of the top frame 200 shown in FIG. 7 and FIGS. 8A, 8B removably couples to the top parallel surface 301 of the insertion alignment frame 300 shown in FIG. 9, FIGS. 10A, 10B, FIG. 11 and FIG. 13. The bottom side 305 of insertion alignment frame 300 is shown in FIG. 9, FIG. 10B, FIG. 11 and FIG. 13. The perimeter outline 329 of the insertion alignment frame 300 shown in FIG. 9 is of similar shape and size as the perimeter outline of the top frame 200 and base plate 211 for easy handling during the inverting (e.g., flipping over) process discussed below.

In operation, the CCGA (LGA) substrate 90 with the corresponding array pattern of pads 91 is held in alignment to the array of interconnect members (e.g., solder columns) 80 while seated in the pocket 210 of a base plate 211 jig-fixture or frame shown in FIG. 7. After placement of the CCGA (LGA) substrate 90 into the pocket 210, in one embodiment the surface height, including the array pattern of pads 91, extends slightly beyond the surface 213 of base plate 211. A thin layer of solder paste can optionally be applied to the array pattern of pads 91 of CCGA (LGA) substrate 90. After optionally applying solder paste to the array pattern of pads 91, the top plate 200 is coupled to the base plate 211. In one embodiment, the top plate 200 is coupled to the base plate 211 via rods that extend through holes in both plates (not shown). However, other suitable coupling mechanisms can be used. Apparatus 10 filled with a plurality of interconnect members 80, securely covered by top cover plate 60 and retention plate 50, is manually placed into the receiving pocket (e.g., female receptacle) of the insertion alignment frame 300 with the ledge 22 of apparatus 10 resting on the shoulder 321 of the alignment frame 300 shown in FIG. 9 and FIGS. 10A, 10B. All fasteners 61 are removed and cover plate 60 is lifted and released from side 12 of apparatus 10. The protruding (e.g., male) planar surface 12 of apparatus 10 is seated in the insertion alignment frame is shown in FIG. 10A, 10B with the cover plate 60 removed. The combined alignment frame consisting of 200 and 211 (internally holding the CCGA (LGA) substrate 90 with solder paste) is manually inverted (flipped upside down) with surface 207 facing downward and surface 212 facing upward. The combined inverted alignment frame is aligned and placed over surface 301 of the insertion alignment frame 300 shown in FIG. 11. The upright uncovered protruding (e.g., male) 12 surface of apparatus 10 plugs into a recessed (e.g., female) socket opening defined by the four inside boundary walls 204 in an inverted (bottom-fed) jig-fixture 200 as shown in FIGS. 8A, 8B. The socket aperture boundary of four walls of 204 connected by corners 201a, 201b, 201c and 201d shown in FIG. 7 and FIGS. 8A, 8B in the jig-fixture is slightly larger than the alignment feature formed by boundary 71a, 71b, 71c and 71d shown in FIGS. 6A, 6B on side 12 of apparatus 10. The four side walls of 25 align with corresponding side walls in the jig-fixture. Concurrently, the socket aperture boundary of four walls of 203 connected by corners 273a, 273b, 273c and 273d shown in FIG. 8A in the jig-fixture is slightly larger than the alignment feature formed by boundary 73a, 73b, 73c and 73d shown in FIG. 1B and FIG. 6B on apparatus 10. The four side walls of 28 align with corresponding side walls in the jig-fixture. The four ledges 22 in FIGS. 2A, 2B, FIGS. 3A, 3B and FIGS. 6A, 6B on the topside of apparatus 10 rests on the four ledge surfaces 206 of the inverted jig-fixture 200. Once aligned, apparatus 10 seated upright in the alignment frame 300 and coupled jig-fixtures 200 and 211 shown in FIG. 12A are together inverted upside down as shown in FIG. 12B, as discussed above, allowing the one or more interconnect members 80 to detach from the apparatus and fall under the force of gravity through a corresponding array pattern in a plurality of holes (e.g., silos) 202 in frame 200 shown in FIG. 7 and FIGS. 8A, 8B onto the CCGA substrate 90 such that the one or more interconnect members 80 contact corresponding array pattern of pads 91. CCGA (LGA) substrate 90 is seated (inserted) into the pocket 210 of the base frame 211 as shown in FIG. 7

Figure 13:
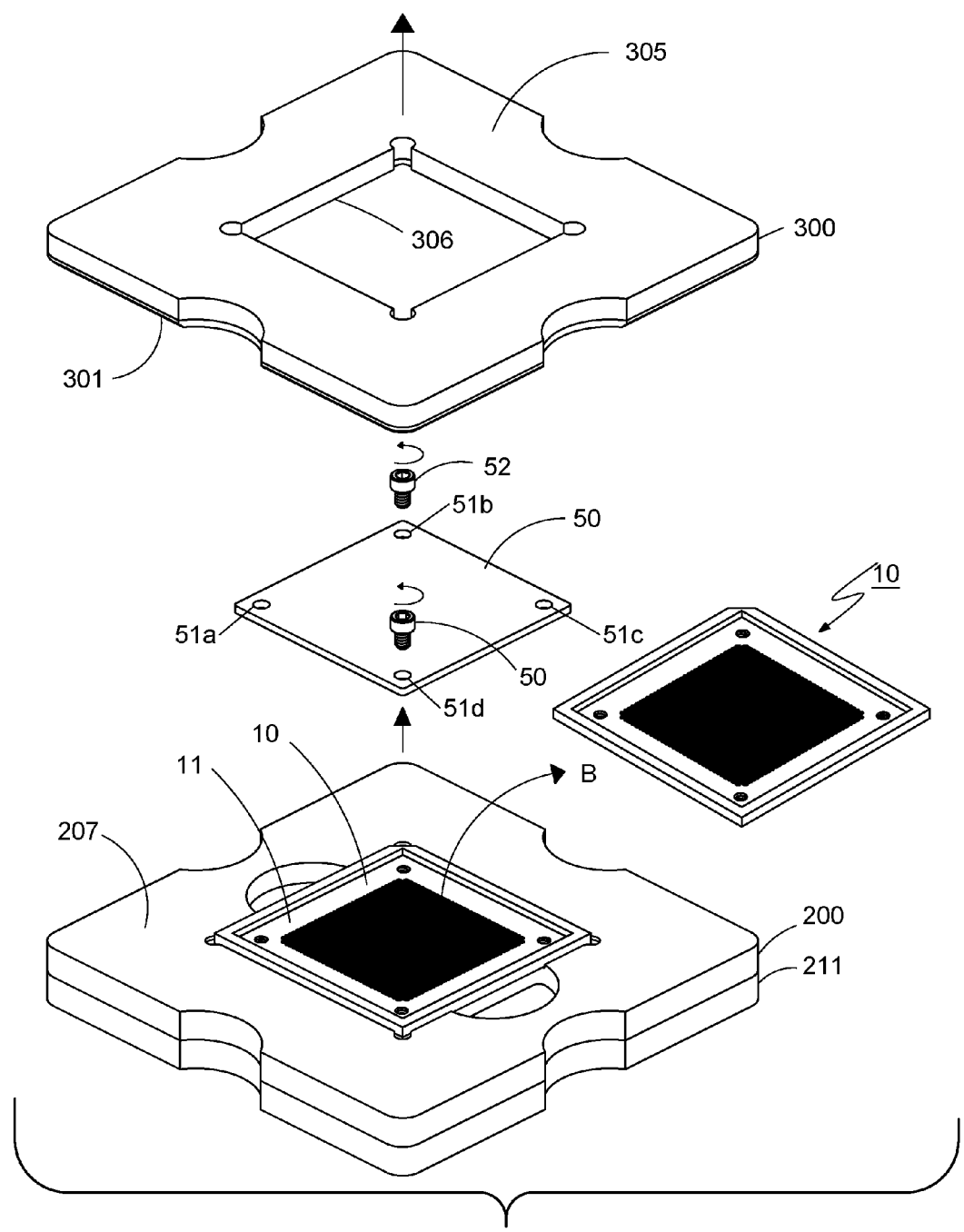
FIG. 13 is an exploded view of a frame apparatus positioned right side up after removing the plastic or metal frame jig-fixture and after the dispensing apparatus has dropped its payload via gravity feed of a plurality of interconnect members.

After inverting (e.g., flipping over) the three coupled plates 300, 200 and 211 shown in FIG. 12B, alignment plate 300 is manually lifted and removed from the coupled frame 200 and 211 shown in FIG. 13. Visual inspection is made by looking through the transparent (or translucent) retainer plate 50 to view if all interconnect members have fallen. Retainer plate 50 can be removed by unscrewing all fasteners 52 and using a tool with one or more pointed probes, or other mechanisms, to dislodge one or more stuck interconnect members 80. After allowing the one or more interconnect members 80 to detach from the apparatus, apparatus 10 is lifted and removed from the top of frame 200 to position B. Once the apparatus 10 is removed, the frame 200, 211 along with the CCGA substrate 90 and interconnect members 80 can be placed in a reflow oven to reflow the solder paste. In one embodiment, the frame 200 can optionally have one or more recesses adjacent the apparatus 10 to facilitate the removal of the apparatus 10 (e.g., allowing the user to grab the sides of the apparatus 10 with their thumbs). Apparatus 10 can be refilled with interconnected members, discarded or recycled.

The outside perimeter aperture 23 shown in FIG. 1A and side walls 26 of the peripheral frame 21 shown in FIG. 1B is slightly larger than the perimeter side walls 25 shown in FIG. 6 of apparatus 10 thus advantageously allowing a plurality of apparatus 10 to be nested and stacked one-into the other during transport. The surface 11 of the plate P is recessed or axially offset relative to the side walls 26, such that the side walls 26 extend upward or protrude from the plane of the plate P.

As shown in FIGS. 1A, 1B and FIGS. 6A, 6B one corner 30 of apparatus 10 is chamfered (e.g., at 45-degrees) to provide a visual orientation and alignment with the CCGA substrate 90.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A system for aligning, dispensing and depositing a plurality of interconnect members onto a column grid array substrate package, comprising:

a body having a peripheral frame and an alignment carrier plate recessed relative to said peripheral frame, the alignment carrier plate having a plurality of holes extending therethrough from a top surface of the alignment carrier plate to a bottom surface of the alignment carrier plate and arranged in a pattern;

a cover plate without adhesive removably coupleable with the top surface and a retention plate without adhesive removably coupleable with the bottom surface of the alignment carrier plate such that the cover and retention plates removably covers the plurality of holes in the alignment carrier plate, said plates not attached to either end of a plurality of cylindrically shaped interconnect members releasably disposed in the plurality of holes, the cover plate manually detachable from the top surface of the alignment carrier plate to release the plurality of interconnect members when inverted upside down such that the plurality of interconnect members drop under the force of gravity onto an array pattern of metallic pads of a column grid array substrate without the use of vibration or vacuum; and a frame for aligning said carrier plate over said column grid array substrate.

2. The system of claim 1, wherein said carrier plate is square or rectangular.

3. The system of claim 1, wherein said carrier plate is made of a material chosen from a group consisting of plastic, ceramic, graphite and metal.

4. The system of claim 1, wherein the interconnect members have a cylindrical shape and said plurality of holes have a larger diameter than the cylindrically shaped interconnect members contained within the holes.

5. The system of claim 4, wherein a thickness of said carrier plate is greater than a length of the cylindrically shaped interconnect members contained within the plurality of holes.

6. The system of claim 1, wherein the surface of the cover and retention plates have a force of sufficient strength to hold and retain said interconnect members in place.

7. The system of claim 1, wherein the interconnect members are solder columns.

8. The system of claim 1, wherein an air gap surrounds the majority of the interconnect members within the holes of said carrier plate.

9. The system of claim 1, wherein the sidewalls of the holes in said carrier plate surround the interconnect members and protect said interconnect members while said interconnect members are retained by the surface of the cover and retention plates.

10. The system of claim 1, wherein the sidewalls of the holes in said carrier plate limit the swaying motion and angle of movement of the interconnect members while said interconnect members are restrained by the non-adhesive surface of the cover and retention plates.

11. The system of claim 1, wherein the shear force created by said interconnect members hitting the sidewalls of the holes during the removal process of the cover plate and inverting the carrier plate upside down creates sufficient annular momentum to release and dislodge the interconnect members from the holes of the carrier plate.

12. The system of claim 1, wherein the cylindrical sidewalls of the holes in the carrier plate define a chute to align, position and guide said interconnect members to drop under the force of gravity onto the substrate.

13. The system of claim 1, wherein an array of countersink holes at the surface of one or more ends of the cylindrical sidewalls of the holes in the carrier plate permits unobstructed depositing, insertion and extraction of said interconnect members.

14. An apparatus for aligning, dispensing and depositing a plurality of cylindrically shaped interconnect members onto column grid array substrate package, comprising:

a body having a peripheral frame and an alignment carrier plate recessed relative to said peripheral frame, the alignment carrier plate having a plurality of holes extending therethrough from a top surface of the plate to a bottom surface of the plate and arranged in a pattern, the top surface removably coverable with one or more cover plates having a non-adhesive surface such that the cover plate removably covers the plurality of holes in the alignment carrier plate, said non-adhesive surface removably restrains the plurality of cylindrically shaped interconnect members releasably disposed in the plurality of holes, the layer manually detachable from the top surface of the alignment carrier plate to release the plurality of interconnect members such that the plurality of interconnect members drop under the force of gravity from the alignment carrier plate when inverted upside down.

15. The apparatus of claim 14, wherein the plurality of interconnect members drop under the force of gravity onto an array pattern of metallic pads of a column grid array substrate without the use of vibration or vacuum.

16. The apparatus of claim 14, wherein said carrier plate is square.

17. The apparatus of claim 14, wherein said carrier plate is made of a material chosen from a group consisting of plastic, ceramic, graphite and metal.

18. The apparatus of claim 14, wherein said plurality of holes have a larger diameter than the cylindrically shaped interconnect members contained within the holes.

19. The apparatus of claim 14, wherein a thickness of said carrier plate is greater than a length of the cylindrically shaped interconnect members contained within the plurality of holes.

20. The apparatus of claim 14, wherein the peripheral frame has a peripheral dimension greater than a peripheral dimension of the recessed alignment carrier plate such that the body is stackable.

21. The apparatus of claim 14, wherein cylindrical sidewalls of the holes in the carrier plate define a chute to align, position and guide said interconnect members to drop under the force of gravity onto the substrate when inverted upside down.

* * * * *

UNITED STATES PATENT AND TRADEMARK OFFICE
CERTIFICATE OF CORRECTION

| | | |
|---|---|---|
| PATENT NO. | : 9,629,259 B1 | Page 1 of 1 |
| APPLICATION NO. | : 15/238437 | |
| DATED | : April 18, 2017 | |
| INVENTOR(S) | : Martin B. Hart et al. | |

It is certified that error appears in the above-identified patent and that said Letters Patent is hereby corrected as shown below:

In the Specification

In Column 8 at Line 60, Change "73c" to --73d--.

In Column 10 at Line 43, After "7" insert --.--.

Signed and Sealed this
First Day of August, 2017

Joseph Matal
*Performing the Functions and Duties of the*
*Under Secretary of Commerce for Intellectual Property and*
*Director of the United States Patent and Trademark Office*